(12) United States Patent
Puttagunta et al.

(10) Patent No.: US 6,242,844 B1
(45) Date of Patent: Jun. 5, 2001

(54) WIDE-BAND SINGLE-PHASE UNIDIRECTIONAL TRANSDUCER

(75) Inventors: Sudhakar Puttagunta, Andhra Pradesh (IN); Kushal K. Bhattacharjee, Scottsdale, AZ (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/473,392

(22) Filed: Dec. 28, 1999

(51) Int. Cl.$^7$ .................................................. H01L 41/08
(52) U.S. Cl. ........................................................ 310/313 B
(58) Field of Search ............................ 310/313 B, 313 R

(56) References Cited

U.S. PATENT DOCUMENTS

| | | | |
|---|---|---|---|
| 4,456,847 | * 6/1984 | Minayawa et al. | 310/313 B |
| 5,550,793 | * 8/1996 | Dufilie | 310/313 B |
| 5,773,911 | * 6/1998 | Tanaka et al. | 310/313 B |
| 5,977,846 | * 11/1999 | Kajihara et al. | 310/313 B |

* cited by examiner

*Primary Examiner*—Mark O. Budd

(57) ABSTRACT

An efficient ripple free wide-band single-phase unidirectional SAW transducer is disclosed which requires only a single tuning circuit and a single matching circuit. The unidirectional transducer includes a pair of bidirectional transducers the first of which is connected to a single-phase drive source and the second is connected to a resonant load such that the second transducer acts as a reflecting transducer to cancel out waves traveling in one direction.

12 Claims, 3 Drawing Sheets

WIDE-BAND SINGLE-PHASE UNIDIRECTIONAL TRANSDUCER

BACKGROUND OF THE INVENTION

1. Field of the Invention

The present invention relates to surface acoustic wave (SAW) devices and more particularly to unidirectional SAW devices driven by a single-phase drive source and which also have a broad passband.

2. Description of Related Art Including Information Disclosed Under 37 CFR 1.97 and 1.98

Surface acoustic wave devices known as SAW devices have many uses, primarily in the UHF and VHF frequency ranges. SAW devices have been especially useful as impedance elements, resonators, and bandpass filters in these frequency ranges. Typical SAW devices have a substrate with at least a surface layer of piezoelectric material and surface acoustic wave transducers in interdigitated form disposed on the piezoelectric surface. The transducers convert an electric signal to surface acoustic waves propagating on the piezoelectric surface and vice versa.

SAW devices are compact, lightweight, robust, and, because they use planar technology, are economical to manufacture. They can be mass-produced using the same techniques developed so successfully for the production of silicon integrated circuits. A wide variety of analog signal processing functions can be achieved with SAW devices. Among other applications, they are currently used in pulse compression radar systems as receiver bandpass filters, or as resonators for stabilizing oscillators in numerous applications. They have replaced many of the coils, capacitors, and metal cavities of conventional radio frequency systems, removing the need for hand alignment and dramatically improving the reliability and performance. They have simultaneously resulted in significant reductions in both size and cost.

However, several problems are associated with the prior art surface acoustic wave transducers. One of the problems occurs because the transducer electrodes cause internal reflections which distort the transducer output and the shape of the input conductance. Another problem occurs when the transducer is used in filter applications. Triple transit distortion is caused by regeneration reflections between the transducers.

In order to eliminate triple transit distortion, three-phase and single-phase prior art devices are used to cause a greater amount of radiation in one direction in the crystal than in the reverse direction and thus form unidirectional transducers. In one configuration proposed for a single-phase unidirectional transducer (SPUDT), a device such as that disclosed in U.S. Pat. No. 4,353,046 is constructed in which the acoustic reflections are used to cancel the regenerative reflections and unidirectional behavior results. These transducers are simple to fabricate and tune and thereby overcome some of the disadvantages of the multiphase devices. However, in these devices the finger and gap widths in a single-phase unidirectional transducer (SPUDT) were typically of split-finger construction and were one-eighth ($\frac{1}{8}$) of the operating acoustic wavelength, thus limiting the frequency range of the device by photolithographic constraints to a maximum frequency of operation when compared to the simplest form of SAW transducer using quarter-wavelength or $\frac{1}{4}$ electrodes.

With $\frac{1}{4}$ electrodes, the reflectivity is unaffected by energy storage as the contributions from the front and back edges cancel. However, at other electrode widths they can significantly affect the value of the reflectivity. Unfortunately, for electrode widths of less than $\frac{1}{4}$, the energy-storage reflections are generally of opposite phase to those resulting from the impedance discontinuities. The result is a substantial reduction in the electrode reflectivity for electrode widths less than $\frac{1}{4}$.

Another two-level SPUDT configuration is set forth in U.S. Pat. No. 4,902,925, incorporated herein by reference in its entirety. This structure, commonly known as the "Hopscotch", employed a group-type sampling with all electrode widths at $\frac{1}{4}$. Like the original SPUDT configuration, the first level of the "Hopscotch" transducer by virtue of the electrode groupings has no net internal reflections. Unidirectionality is only achieved by the addition of a second level metalization with this structure. However, since the electrode widths are $\frac{1}{4}$, rather than $\frac{1}{8}$ as in the original split-finger structure, greater internal reflectivity levels are achieved. Unfortunately, as a result of the sparse group type sampling the structure, the effective coupling is substantially reduced. The latter severely limits the maximum bandwidth or minimum insertion loss achievable with this transducer. In addition, this structure has significant group responses not far below the passband.

Independent from the "Hopscotch" transducer, another concept for a SPUDT was proposed which relies on unique crystal orientations as set forth in U.S. Pat. No. 4,910,839, incorporated herein by reference in its entirety. On these unique crystal orientations, a simple two-electrode-per-wavelength transducer exhibits unidirectional characteristics. Unfortunately, on these natural SPUDT (NSPUDT) orientations, the sense of directionality is determined by material properties of the crystal substrate and overlay material rather than by the transducer configuration as with other approaches. Consequently, reversing the sense of the directivity of the transducer is difficult.

Still another approach set forth in U.S. Pat. No. 5,073,763 relates to GSPUDT structures with $\frac{3}{8}\lambda$ and $\frac{5}{8}\lambda$ sampling. Reflectionless or unidirectional transducers and broad-band notch elements are all implementable with these configurations. The GSPUDTs disclosed in this patent are similar to the conventional SPUDT (CSPUDT) and the "Hopscotch" transducers in that single-level versions are reflectionless. Unidirectional characteristics are obtainable only from the two-level structure, but: (1) they can be made unidirectional on either CSPUDT or NSPUDT crystal orientations (2) they can be made unidirectional in either the forward or reverse directions by a simple change to the second level metalization; (3) they have greater coupling than many other types of transducers; and (4) they have smaller geometry than other transducers. Thus, this type of transducer can be used in combination with an NSPUDT transducer to implement low-loss filters, resonators, or the like.

These SAW transducers have a pattern of interdigitated electrodes on a piezoelectric substrate. The electrodes lie on the substrate on either a $\frac{3}{8}\lambda$ or $\frac{5}{8}\lambda$ grid such that adjacent electrodes have either a center-to-center spacing of $\frac{3}{8}\lambda$ or a center-to-center spacing of $\frac{5}{8}\lambda$. The electrodes do not have to be physically located at every $\frac{3}{8}\lambda$ or $\frac{5}{8}\lambda$. However, it is important to have a $\frac{3}{8}$ or $\frac{5}{8}$, group-type sampling which means that even if the transducer is withdrawal weighted, the remaining electrodes are always centered on the $\frac{3}{8}\lambda$ or $\frac{5}{8}$ grid with any adjacent electrodes having either a $\frac{3}{8}\lambda$ or $\frac{5}{8}\lambda$ center-to-center spacing depending upon whether the transducer is a $\frac{3}{8}\lambda$ structure or a $\frac{5}{8}\lambda$ structure.

SUMMARY OF THE INVENTION

Therefore, the purpose of the present invention is to provide an efficient ripple-free wide-band single-phase SAW (surface acoustic wave) transducer which requires only a single tuning and matching circuit. The apparatus of the invention includes a support structure with a resonant load. A first SAW transducer having fingers with a selected spacing is connected to the resonant load. There is also provided a single-phase drive source which is connected to a second SAW transducer having fingers with the same spacing as the first transducer. The fingers of the second SAW transducer and the first SAW transducer are interlaced with a lateral off-set spacing of $n\lambda + \lambda/4$, where the n is zero or an integer number. In one embodiment of the invention the n is equal to zero and the support structure comprises a layer of glass or quartz over which there is deposited a ground plane. A layer of $Z_nO$ or any other suitable piezoelectric material was then deposited on top of the ground plane and then the first and second bidirectional SAW transducers are deposited on top of the piezoelectric material.

In another embodiment, the $n\lambda$ is again set to zero and then one of the two SAW transducers are deposited on top of the layer of support structure, and then a planar layer of $Z_nO$ or other suitable piezoelectric material is deposited over the combination of the support structure and the first SAW transducer. After the $Z_nO$ or other suitable piezoelectric material is deposited over this combination, the second SAW transducer is deposited on top of the piezoelectric material.

Yet, according to another embodiment the n of $n\lambda$ is set to some small integer (for example only, 2–6) and both of the SAW transducers are group-type transducers. There is further included a meandering ground structure also having fingers which is interleaved between the fingers of the first and second SAW transducers. This embodiment can be made still more efficient by including insulated crossovers between the meandering ground structure and the bus bars of the two SAW transducers thereby reducing ohmic losses. The insulation for the cross-over can be a layer of $SiO_2$ of the suitable thickness which layer can be present on the SAW propagation path. The thickness of the $SiO_2$ layer is preferably chosen to reduce the temperature coefficient of delay and power flow angle of the surface acoustic waves.

BRIEF DESCRIPTION OF THE DRAWINGS

These and other features of the present invention will be more fully disclosed when taken in conjunction with the following Detailed Description of the Preferred Embodiment(s) in which like numerals represent like elements and in which.

DETAILED DESCRIPTION OF THE
PREFERRED EMBODIMENT(S)

Figure 1:
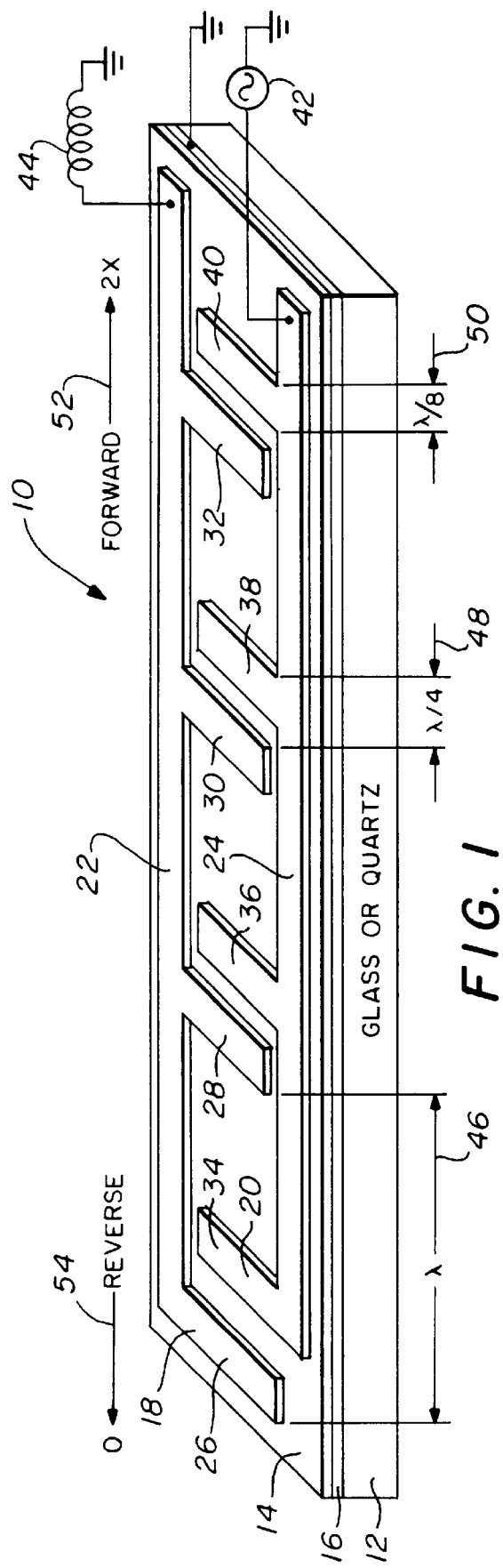
FIG. 1 shows a perspective view of one embodiment of the present invention having a ground plane at the interface of a glass or quartz substrate and the layer of $Z_nO$ or other piezoelectric material.

Referring now to FIG. 1, there is shown a first embodiment of the present invention generally at 10. According to this embodiment, there is a glass or quartz support structure or substrate 12 and a layer 14 of suitable piezoelectric material such as for example $Z_nO$ which, along with the glass or quartz substrate 12, are on each side of ground plane 16. Deposited on top of the layer of piezoelectric material is a pair of bidirectional type SAW transducers 18 and 20. As shown in this example, each of the bidirectional transducers 18 and 20 include a bus bar, such as bus bar 22 on SAW transducer 18 and bus bar 24 on SAW transducer 20. Also included are fingers 26, 28, 30, and 32 extending from bus bar 22 of transducer 18. In a like manner, there are fingers 34, 36, 38, and 40 extending from bus bar 24 of transducer 20. Also as shown, attached to bus bar 24 of transducer 20 is a single-phase drive source 42. In a similar manner, a resonant load 44 is attached to bus bar 22 of SAW transducer 18.

As shown, the fingers of the two SAW transducers are interlaced with each other. It should also be understood, that the spacing between the fingers of SAW transducer 18 is selected to be equal to one wavelength of a selected operating frequency, as is indicated by the spacing indicated as $\lambda$ at reference number 46. It should also be appreciated that the spacing between the fingers of SAW transducer 20 is the same as the spacing between the fingers of SAW transducer 18. In addition, as indicated by the $\lambda/4$ spacing shown at reference number 48, the offset of equivalent edges of fingers of the two different SAW transducers is selected to be $\lambda/4$ or $n\lambda + \lambda/4$ for other selected embodiments. Also, in the preferred embodiment the width of the fingers of both the SAW transducer 18 and SAW transducer 20 is equivalent to $\lambda/8$ as indicated by the measurement shown by reference number 50. Thus, according to this invention, a unidirectional SAW device results from a pair of bidirectional transducers on top of a layer 14 of $Z_nO$ or other suitable piezoelectric material which has a ground plane 16 sandwiched between the glass or quartz substrate 12 and the piezoelectric layer 14. Further, according to this embodiment, one of the two bidirectional transducers terminates at a resonant load such as resonant load 44. Resonant load 44 may preferably be a high Q tuning inductor connected to SAW transducer 18. SAW transducer 18 will then act as a good reflector of surface acoustic waves and have an excellent passband shape with sharp skirts equivalent to a 40 dB to 3 dB shape factor of about 1.6 to 2.0 and low side lobes at minus 30 dB or lower. Further, the combination of the two SAW transducers will be unidirectional as indicated by the forward arrow 52 showing a positive direction of travel with zero travel going in the reverse direction indicated by arrow 54, and this is all accomplished by the single-phase drive source 42. Thus, multi-phase sources are not required and only a single matching circuit is required.

Further, since in the present embodiment the effective center of the reflector transducer is laterally offset from that of the driving transducer 20, by a quarter wavelength ($\lambda/4$) the unidirectionality of the transducer is excellent over a large fractional bandwidth and this ensures a ripple free passband.

Figure 2:
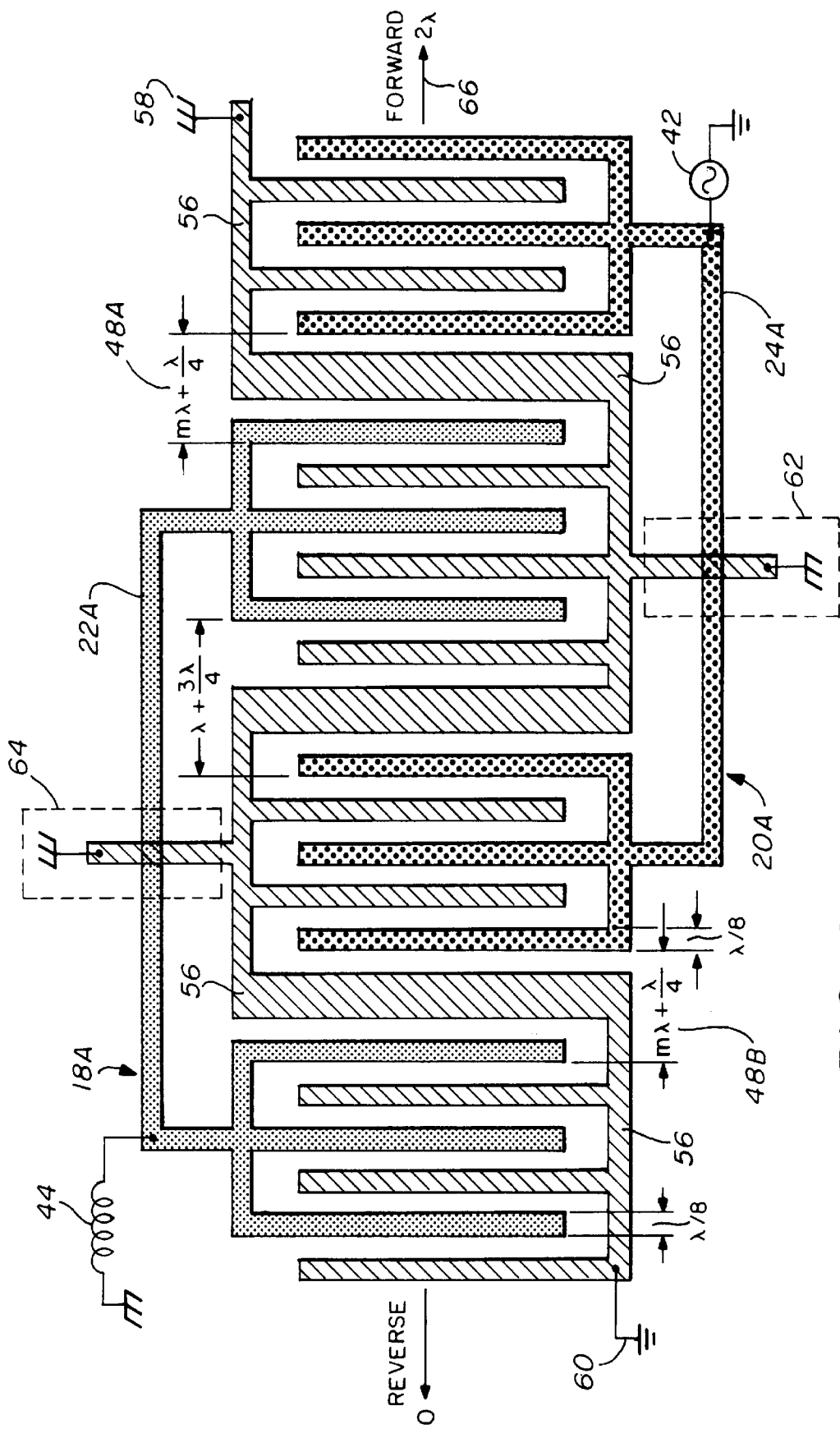
FIG. 2 is another embodiment of the present invention using group-type IDTs (interdigitated transducers)

Refer now to FIG. 2, there is shown a top view of another embodiment of the present invention using group type IDTs (interdigitated transducers) although substantially different in appearance, the operation of this dual transducers to provide a unidirectional transducer is similar to that discussed above. Likewise, some of the common components will bear the same reference number. Thus, as shown there is a first bidirectional transducer 18A having a bus bar 22A connected to a resonant load 44 which is a high Q tuning inductor. However, unlike the transducers shown in FIG. 1, transducer 18A is a multi-fingered or group-type transducer. Likewise, transducer 20A is connected to a signal source 42 and also is a multi-fingered or group-type transducer. However, according to this embodiment the "n" of nλ is selected to be three. The lateral offset of the two transducers 18A and 20A however is still ¾ as indicated by reference number 48A. In addition to the transducers I 8A and 20A being multi-fingered, unlike the embodiment of FIG. 1 which used a ground plane between the glass or quartz support structure 12 and the layer 14 of piezoelectric material, this embodiment of FIG. 2 uses a meandering ground bus bar 56 which is connected to ground at locations 58 and 60. Extending from meandering ground bus bar 56 are also multi-fingers which are interleaved with the multi-fingers of the transducers 18A and 20A. Although not necessary for the operation of the embodiment of FIG. 2, to reduce the ohmic losses of the meandering ground bus bar 56, there are shown two crossover areas 62 and 64 which also connect directly to ground. Thus, it would be appreciated by those skilled in the art, the operation of the embodiment of FIG. 2 is substantially similar to that discussed above with respect to FIG. 1.

Figure 3:
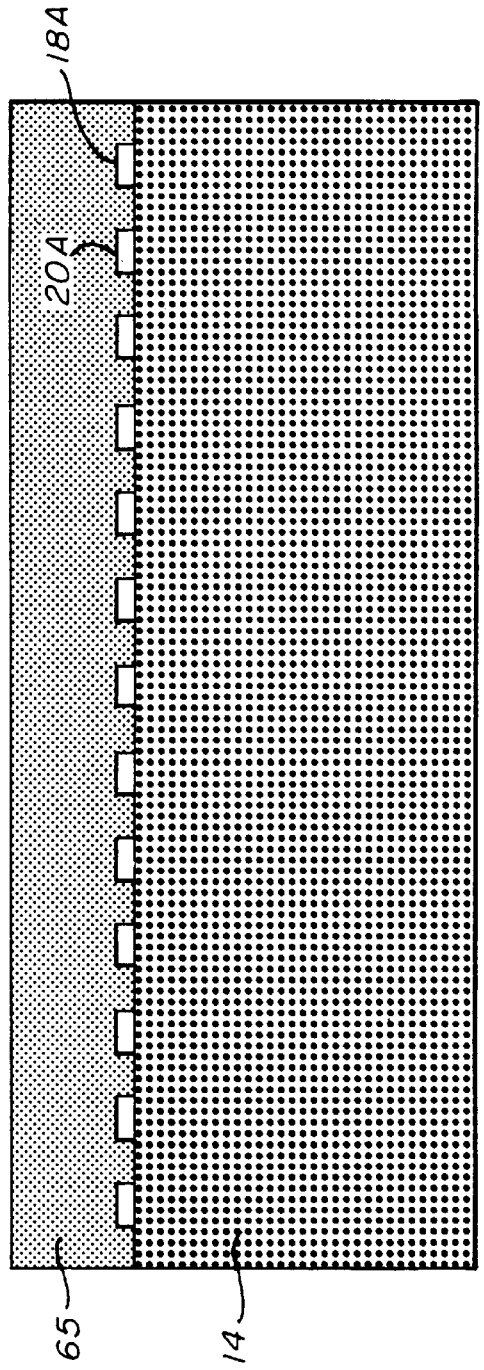
FIG. 3 represents a partial cross-section of the device of FIG. 2 showing the two bidirection transducers and the insulative layer of $SiO_2$.

The insulation for the crossovers can be $SiO_2$ and according to one embodiment of the invention, this layer 65 (see FIG. 3) $SiO_2$ can be present over the entire SAW propagation path including over the IDTs 18A and 20A. By selecting a proper thickness of the $SiO_2$ layer, the temperature coefficient of SAW delay and power flow angle of SAW would be substantially reduced. A cross section of this is as shown in FIG. 3. Thus, this $SiO_2$ layer provides the insulation for the crossovers and also gives a substantial improvement in temperature stability and power flow angle of the SAW device. Likewise, as it is indicated by the forward arrow 66 the result is a unidirectional transducer with the surface waves going in only one direction.

Figure 4:
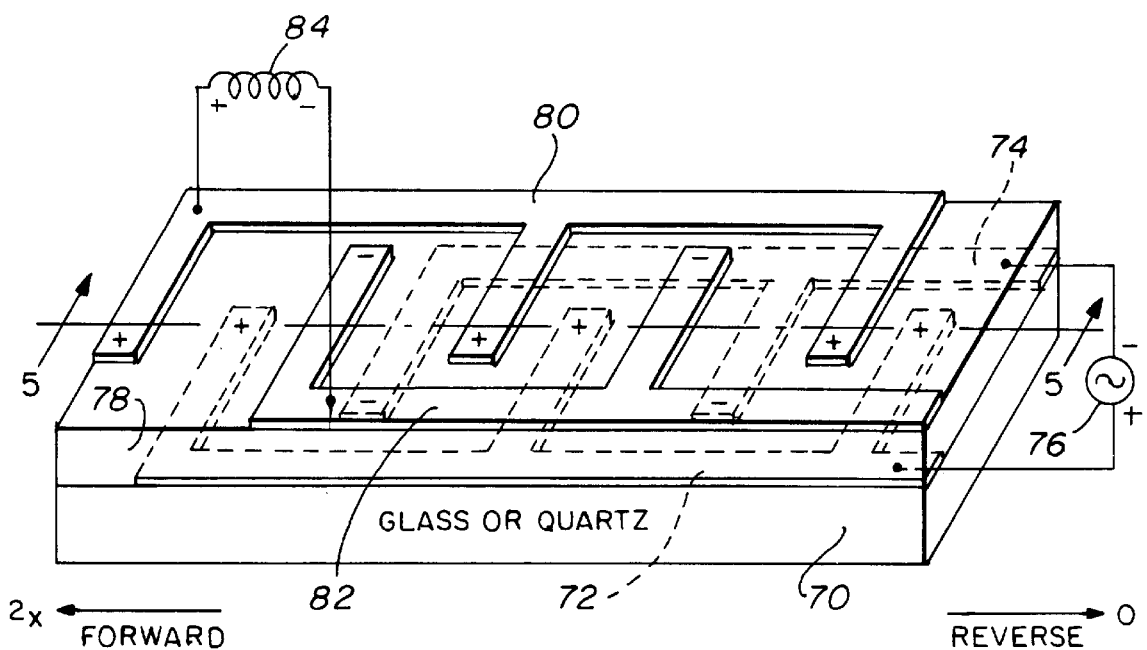
FIGS. 4 and 5 are perspective and cross-sectional views, respectively, of still another embodiment of the present invention using two IDTs, wherein one IDT is located on a substrate and covered by a layer of piezoelectric material and the second IDT is on the top surface of the layer of piezoelectric material.
Figure 5:
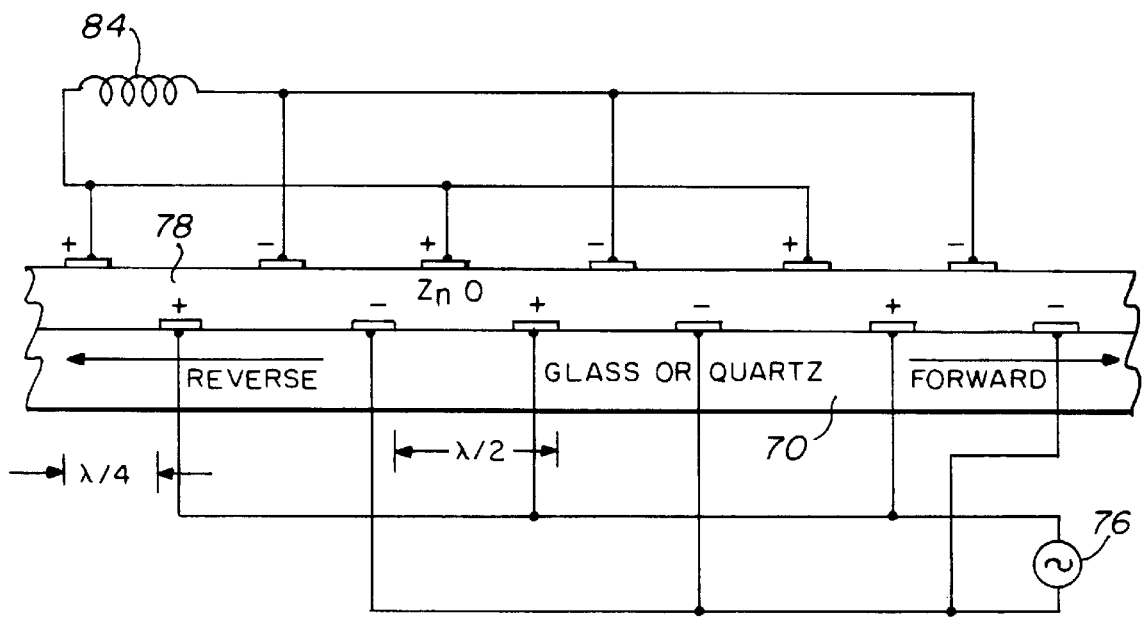

Referring now to FIGS. 4 and 5 there is shown a perspective view and a cross-sectional view, respectively, of still another embodiment of the present invention. According to this embodiment, there is a glass or quartz substrate 70 over which is deposited the positive group fingers 72 and the negative group fingers 74 of a typical bidirectional SAW transducer. As shown, the fingers of the two portions are interleaved but do not touch. Connected between the positive portion 72 and negative portion 74 is a single-phase drive source 76. A $Z_nO$ layer 78 or other suitable piezoelectric material is then deposited over the combination of the substrate 70 and both portions 72 and 74 of the first SAW transducer. A second bidirectional SAW transducer having positive portions 80 and negative portions 82 is then deposited on the top of the layer 78 of piezoelectric material. However, instead of the single-phase drive source 76 applied to the first SAW transducer having portions 72 and 74, there is instead a high Q tuning inductor 84 connected as a resonant load to this second or top transducer.

Referring now to FIG. 5, there showing a cross-sectional view taken along lines 5—5 of FIG. 4 which may better illustrate the operation of the resulting unidirectional transducer formed by the combination of bidirectional transducers. As shown in this example, this spacing of the fingers of each portion of the transducers is λ⁄2, and the offset from the fingers of negative portions 74 of the lower level and negative portion 82 of the top level transducer is ¾. It should also be noted that in this embodiment the width of the fingers is ¼.

The corresponding structures, materials, acts, and equivalents of all means or step plus function elements in the claims below are intended to include any structure, material, or act for performing the function in combination with other claimed elements as specifically claimed.

What is claimed is:

1. A single-phase unidirectional SAW transducer comprising:
   a support structure;
   a resonant load;
   a first SAW transducer having fingers with a selected spacing, said first SAW transducer connected to said resonant load;
   a single-phase drive source;
   a second SAW transducer having fingers with said selected spacing, said second SAW transducer connected to said single-phase drive source, and said fingers of said second SAW transducer having a lateral offset of nλ+λ⁄4 with respect to said first SAW transducer, where n is zero or an integer number; and
   a piezoelectric material in contact with both of said first and second SAW transducers.

2. The transducer of claim 1 wherein n equals zero and said support structure comprises a layer of glass or quartz and a ground plane covering said layer of glass or quartz, said layer of piezoelectric material being deposited on top of said ground plane and said first and second SAW transducers being deposited on top of said piezoelectric material.

3. The transducer of claim 2 wherein said fingers of said first and second SAW transducers have a width of λ⁄8.

4. The transducer of claim 1 wherein one of said first and second SAW transducers is deposited on top of said support structure, and said layer of piezoelectric material is deposited over the combination of said support structure and the SAW transducer deposited on top of said support structure, and wherein the other one of the first and second SAW transducers is deposited on top of said layer of piezoelectric material.

5. The transducer of claim 4 wherein n is equal zero, and further comprising a capacitance connected to one of said first and second SAW transducers to reduce coupling there between.

6. The transducer of claim 1 wherein said first and second SAW transducers are group-type transducers each having fingers extending from a bus bar and wherein n equals an integer and further including a meandering ground having fingers interleaved between the fingers of said first and second SAW transducers.

7. The transducer of claim 6 and further including insulated crossovers between said meandering ground and said bus bars of said transducers to reduce ohmic losses.

8. The transducer of claim 7 wherein the insulation for said insulated crossover is a suitable layer of $SiO_2$ over the propagation path to reduce the temperature dependance and power flow angle of the surface acoustic wave.

9. The transducer of claim 1 wherein said piezoelectric material is $Z_nO$.

10. The transducer of claim 2 wherein said piezoelectric material is $Z_nO$.

11. The transducer of claim 4 wherein said piezoelectric material is $Z_nO$.

12. The transducer of claim 6 wherein said piezoelectric material is $Z_nO$.

* * * * *